(12) United States Patent
Nakamura

(10) Patent No.: US 10,224,814 B2
(45) Date of Patent: Mar. 5, 2019

(54) CONTROL CIRCUIT OF SWITCHING POWER-SUPPLY DEVICE AND SWITCHING POWER-SUPPLY DEVICE

(71) Applicant: SANKEN ELECTRIC CO., LTD., Niiza-shi, Saitama (JP)

(72) Inventor: Masaru Nakamura, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 78 days.

(21) Appl. No.: 15/241,071

(22) Filed: Aug. 19, 2016

(65) Prior Publication Data

US 2018/0054117 A1    Feb. 22, 2018

(51) Int. Cl.
*H02M 3/158* (2006.01)
*H02M 1/08* (2006.01)
*H03K 17/16* (2006.01)
*H02M 1/00* (2006.01)

(52) U.S. Cl.
CPC .............. *H02M 3/158* (2013.01); *H02M 1/08* (2013.01); *H03K 17/166* (2013.01); *H02M 2001/0009* (2013.01); *H02M 2001/0029* (2013.01)

(58) Field of Classification Search
CPC ...... H02M 3/158; H02M 3/156; H02M 3/155; H02M 3/157; H02M 3/1563; G05F 3/16; G05F 3/185

USPC ................................. 323/271, 282–285, 311
See application file for complete search history.

(56) References Cited

U.S. PATENT DOCUMENTS

| | | | | |
|---|---|---|---|---|
| 2004/0207372 A1* | 10/2004 | Yoshikawa | ............. | H02M 1/38 323/282 |
| 2007/0109707 A1* | 5/2007 | Honda | ................. | H03K 17/166 361/100 |
| 2014/0159687 A1* | 6/2014 | Lee | ..................... | H02M 3/1588 323/282 |

FOREIGN PATENT DOCUMENTS

JP    2010-074972    4/2010

* cited by examiner

*Primary Examiner* — Nguyen Tran
(74) *Attorney, Agent, or Firm* — Banner & Witcoff, Ltd.

(57) ABSTRACT

A control circuit of a switching power-supply device that converts a first DC voltage supplied from an input power source into a second DC voltage by turning on/off a switching element connected between the input power source and an inductor and outputs the second DC voltage, the control circuit includes a drive circuit that, when a control signal to turn on the switching element is received, drives the switching element by supplying a plurality of drive voltages starting in order from a lowest drive voltage among the plurality of drive voltages, to a control terminal of the switching element.

9 Claims, 10 Drawing Sheets

CONTROL CIRCUIT OF SWITCHING POWER-SUPPLY DEVICE AND SWITCHING POWER-SUPPLY DEVICE

TECHNICAL FIELD

The present invention relates to a control circuit of a switching power-supply device and a switching power-supply device.

BACKGROUND

As a method for generating a stable voltage lower than an input voltage, non-insulating type step-down chopper circuits are widely used.

For example, JP-A-2010-74972 discloses a non-insulating type step-down chopper circuit, which supplies a high gate drive voltage to a gate terminal of a metal-oxide semiconductor field-effect transistor (MOSFET) arranged on the high side until the MOSFET disposed on the high side turns on and decreases the gate drive voltage when the MOSFET is in the ON state, thereby suppressing noises generated in an output voltage.

In a non-insulating type step-down chopper circuit, at the moment when a gate drive voltage of a MOSFET disposed on the high side rises and arrives at a threshold voltage of the MOSFET so as to cause the MOSFET to be the ON state, most of a gate charging current flows through a drain terminal through drain-to-gate feedback capacitance of the MOSFET. Therefore, a level difference occurs in the waveform of a gate voltage of the MOSFET disposed on the high side, and the on-resistance of the MOSFET disposed on the high side rapidly increases. As a result, a counter-electromotive force is generated in the input terminal of the step-down chopper circuit in accordance with a parasitic inductor generated in an input wiring.

As the gate drive voltage becomes high with respect to the threshold voltage of the MOSFET disposed on the high side, a change in the on-resistance of the MOSFET increases. Therefore, the generated counter-electromotive force tends to increase. According to the counter-electromotive force, there is a possibility that a noise is generated in the output voltage or the circuit is damaged.

In order to suppress the generation of the counter-electromotive force, it is effective to configure the inclination of a rising edge of the waveform of the gate voltage of the MOSFET disposed on the high side to be gentle. However, according to such a method, a switching loss increases, and thus the power conversion efficiency decreases.

In the step-down chopper circuit described in JP-A-2010-74972, until the MOSFET disposed on the high side is in the ON state, a high gate drive voltage is supplied to the gate terminal. For this reason, an increase in a difference between the threshold voltage and the gate drive voltage of the MOSFET disposed on the high side cannot be avoided, and the generation of a counter-electromotive force cannot be suppressed.

SUMMARY

The present disclosure provides a control circuit of a switching power-supply device capable of suppressing the generation of a counter-electromotive force and a switching power-supply device including the control circuit.

According to this disclosure, a control circuit of a switching power-supply device that converts a first DC voltage supplied from an input power source into a second DC voltage by turning on/off a switching element connected between the input power source and an inductor and outputs the second DC voltage, the control circuit includes: a drive circuit that, when a control signal to turn on the switching element is received, drives the switching element by supplying a plurality of drive voltages starting in order from a lowest drive voltage among the plurality of drive voltages, to a control terminal of the switching element.

A switching power-supply device of this disclosure includes: the above described control circuit of the switching power-supply device; and a switching element that is controlled by the control circuit.

According to the control circuit of the switching power-supply device and the switching power-supply device of the present disclosure, the generation of a counter-electromotive force is suppressed, and thus a low noise and high reliability can be realized.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Hereinafter, embodiments of the present invention will be described with reference to the drawings.

[First Embodiment]

Figure 1:
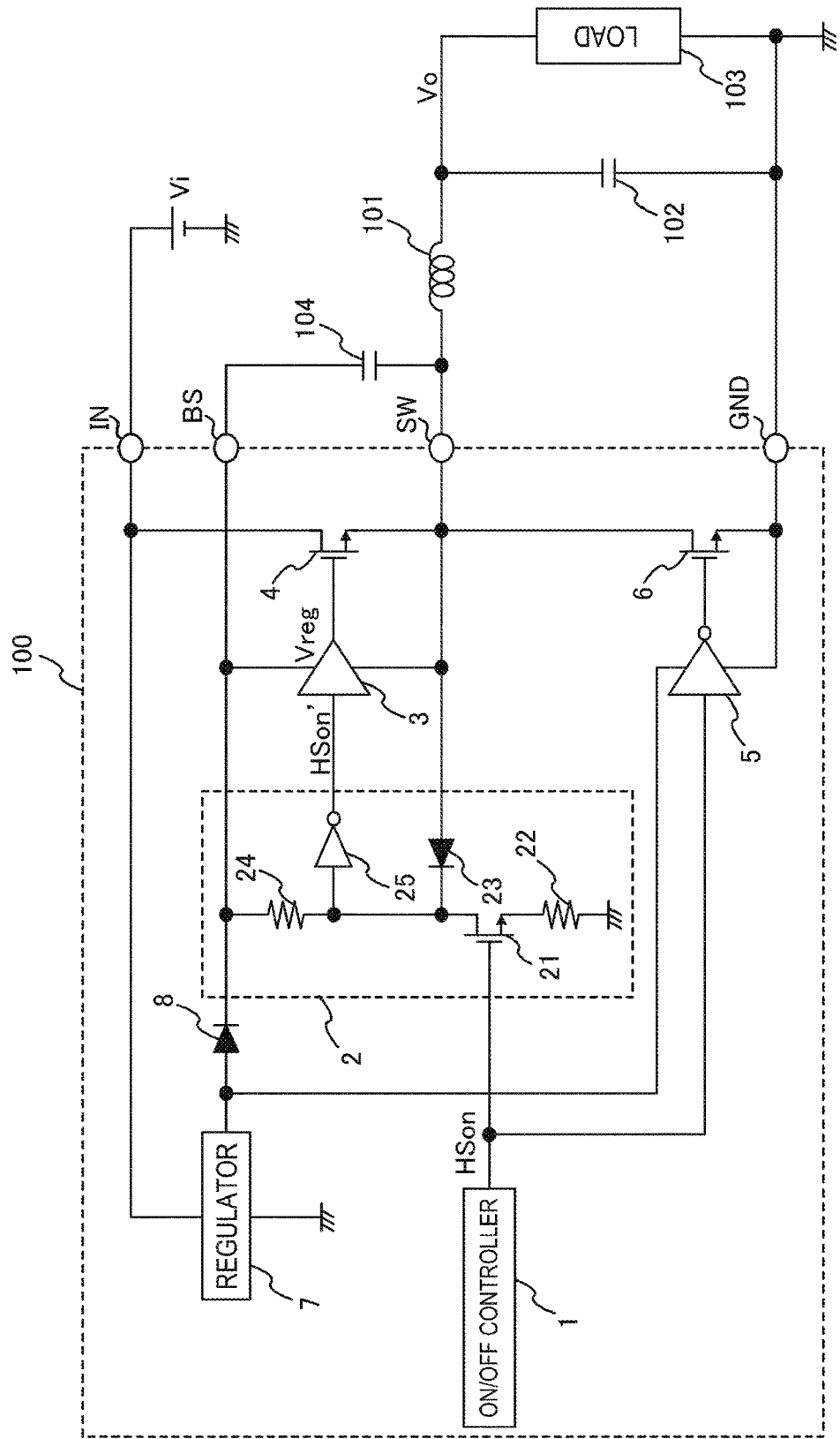
FIG. 1 is a circuit diagram of a switching power-supply device according to an embodiment of the present invention.

FIG. 1 is a circuit diagram of a switching power-supply device according to an embodiment of the present invention.

The switching power-supply device illustrated in FIG. 1 includes a control circuit 100, an inductor 101, an output capacitor 102, an output load 103, and a bootstrap capacitor 104.

An input power source supplying a first DC voltage Vi is connected to an input terminal IN of the control circuit 100.

The inductor 101 has one end connected to a switching terminal SW of the control circuit 100 and the other end connected to the output load 103.

The bootstrap capacitor 104 has one end connected to a bootstrap terminal BS of the control circuit 100 and the other end connected to a connection point between the switching terminal SW and the inductor 101.

The output capacitor 102 has one end connected to a connection point between the inductor 101 and the output load 103 and the other end grounded.

The output load 103 is connected to a connection point between the inductor 101 and the output capacitor 102.

The control circuit 100 includes: an on/off control unit (On/Off control) 1; a level shift circuit 2; a high-side drive circuit 3; a high-side MOSFET 4 functioning as a switching element; a low-side drive circuit 5; a low-side MOSFET 6; a regulator 7; and a reverse-flow preventing diode 8. In the control circuit 100, the high-side MOSFET 4 and the low-side MOSFET 6 may be externally arranged.

The regulator 7 generates a power source voltage based on the first DC voltage Vi supplied from the input terminal IN and outputs the generated power source voltage. The regulator 7 charges the bootstrap capacitor 104 through the reverse-flow preventing diode 8 and the level shift circuit 2 and supplies the power source voltage to the low-side drive circuit 5.

An anode of the reverse-flow preventing diode 8 is connected to the regulator 7, and a cathode of the reverse-flow preventing diode 8 is connected to the bootstrap terminal BS. A power supply terminal of the high-side drive circuit 3 is connected to a connection point between the cathode of the reverse-flow preventing diode 8 and the bootstrap terminal BS.

The on/off controller 1 generates a control signal HSon used for controlling on/off of the high-side MOSFET 4 and the low-side MOSFET 6. The on/off controller 1 supplies the control signal HSon to the level shift circuit 2 and the low-side drive circuit 5. The control signal HSon is a signal in which a high level and a low level are alternately repeated. The control signal HSon of the high level is a control signal to turn on the high-side MOSFET 4 and turning off the low-side MOSFET 6. The control signal HSon of the low level is a control signal to turn off the high-side MOSFET 4 and turning on the low-side MOSFET 6.

The switching power-supply device illustrated in FIG. 1 causes the high-side MOSFET 4 and the low-side MOSFET 6 to alternately operated to be switched using the control signal HSon supplied from the on/off controller 1 to convert the first DC voltage Vi supplied from an input power source into a second DC voltage Vo and then supply the second DC voltage to the output load 103.

The level shift circuit 2 includes a level shift Nch-MOSFET 21, a resistor 22, a diode 23, a resistor 24, and an inverter 25.

A gate terminal of the level shift Nch-MOSFET 21 is connected to the output of the on/off controller 1. A drain terminal of the level shift Nch-MOSFET 21 is connected to one end of the resistor 24. A source terminal of the level shift Nch-MOSFET 21 is connected to one end of the resistor 22.

The other end of the resistor 22 is grounded, and the other end of the resistor 24 is connected to the connection point between the cathode of the reverse-flow preventing diode 8 and the bootstrap terminal BS.

A cathode of the diode 23 is connected to a connection point between the drain terminal of the level shift Nch-MOSFET 21 and the resistor 24. An anode of the diode 23 is connected to a connection point between a source terminal of the high-side MOSFET 4 and a drain terminal of the low-side MOSFET 6.

An input terminal of the inverter 25 is connected to a connection point between the resistor 24 and the drain terminal of the level shift Nch-MOSFET 21. An output terminal of the inverter 25 is connected to an input terminal of the high-side drive circuit 3.

In a state where the control signal HSon input from the on/off controller 1 is at a low level, the level shift Nch-MOSFET 21 is in the OFF state and the input of the inverter 25 is at the high level. Therefore, the level shift circuit 2 supplies a control signal HSon' of the low level to the high-side drive circuit 3. In this state, the bootstrap capacitor 104 is charged through the reverse-flow preventing diode 8.

On the other hand, in a state where the control signal HSon input from the on/off controller 1 is at a high level, the level shift Nch-MOSFET 21 is in the ON state and the input of the inverter 25 is at the low level. Therefore, the level shift circuit 2 supplies a control signal HSon' of the high level to the high-side drive circuit 3. Accordingly, the control signal HSon' becomes a signal synchronized with the control signal HSon and becomes a control signal used for driving the high-side MOSFET 4.

An output terminal of the high-side drive circuit 3 is connected to a gate terminal of the high-side MOSFET 4. In a state where the control signal HSon' input from the level shift circuit 2 is at the high level, the high-side drive circuit 3 operates using a power source voltage Vreg supplied form the bootstrap capacitor 104.

A drain terminal of the high-side MOSFET 4 is connected to the input terminal IN, and a source terminal of the high-side MOSFET 4 is connected to the drain terminal of the low-side MOSFET 6. The high-side MOSFET 4 is driven to be tuned On/Off by controlling the voltage of a gate terminal by using the low-side drive circuit 5. The gate terminal of the high-side MOSFET 4 functions as a control terminal.

An input terminal of the low-side drive circuit 5 is connected to an output terminal of the on/off controller 1, and an output terminal of the low-side drive circuit 5 is connected to a gate terminal of the low-side MOSFET 6. The low-side drive circuit 5 operates using a power source voltage supplied from the regulator 7.

A drain terminal of the low-side MOSFET 6 is connected to the source terminal of the high-side MOSFET 4, and a source terminal of the low-side MOSFET 6 is connected to a ground terminal GND of the control circuit 100. The ground terminal GND is grounded.

A connection point between the source terminal of the high-side MOSFET 4 and the drain terminal of the low-side MOSFET 6 is connected to the anode of the diode 23 configuring the level shift circuit 2 and the switching terminal SW, respectively.

Figure 2:
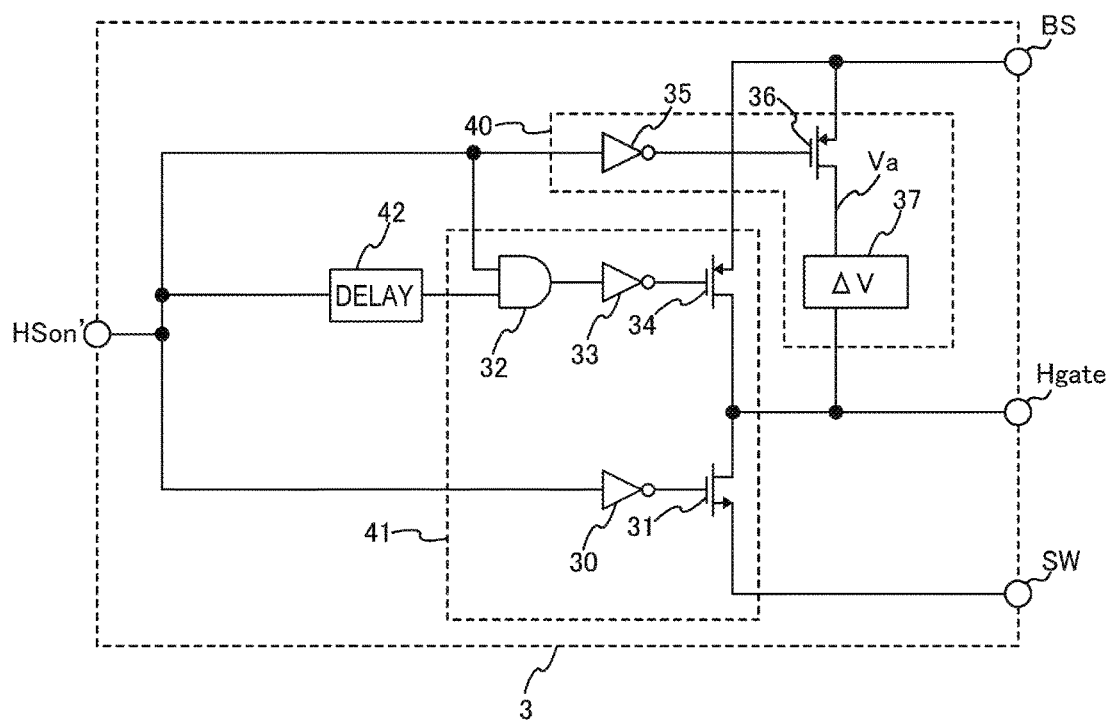
FIG. 2 is an example of the circuit configuration of a high-side drive circuit 3 of the switching power-supply device illustrated in FIG. 1.

FIG. 2 is an example of the circuit configuration of the high-side drive circuit 3 of the switching power-supply device illustrated in FIG. 1. A gate terminal Hgate illustrated in FIG. 2 represents the gate terminal of the high-side MOSFET 4 illustrated in FIG. 1.

The high-side drive circuit 3 includes a sub drive circuit 40, a main drive circuit 41, and a delay circuit (DELAY) 42 that outputs the control signal HSon' with delayed by a time predetermined in advance.

The sub drive circuit 40 includes an inverter 35, a Pch-MOSFET 36, and a voltage-difference generating circuit 37.

The voltage-difference generating circuit 37 is a circuit to generate a first drive voltage lower than the power source voltage Vreg from the power source voltage Vreg input to the bootstrap terminal BS and thus to supply the first drive voltage to the gate terminal Hgate.

The first drive voltage is set to a value equal to or higher than a threshold voltage Vth required for tuning on the high-side MOSFET 4. The voltage-difference generating circuit 37 functions as a voltage generating circuit.

A source terminal of the Pch-MOSFET 36 is connected to the bootstrap terminal BS, and a drain terminal of the Pch-MOSFET 36 is connected to an input terminal of the voltage-difference generating circuit 37. An output terminal of the voltage-difference generating circuit 37 is connected to the gate terminal Hgate.

An input terminal of the inverter 35 is connected to the output terminal of the inverter 25 illustrated in FIG. 1, and an output terminal of the inverter 35 is connected to the gate terminal of the Pch-MOSFET 36.

The main drive circuit 41 includes an inverter 30, an Nch-MOSFET 31, an AND circuit 32, an inverter 33, and a Pch-MOSFET 34.

A source terminal of the Nch-MOSFET 31 is connected to the switching terminal SW, and a drain terminal of the Nch-MOSFET 31 is connected to a source terminal of the Pch-MOSFET 34. A connection point between the drain terminal of the Nch-MOSFET 31 and the source terminal of the Pch-MOSFET 34 is connected to the gate terminal Hgate. A drain terminal of the Pch-MOSFET 34 is connected to the bootstrap terminal BS.

An input terminal of the inverter 30 is connected to the output terminal of the inverter 25 illustrated in FIG. 1, and an output terminal of the inverter 30 is connected to a gate terminal of the Nch-MOSFET 31.

The output terminal of the inverter 25 illustrated in FIG. 1 is connected to one input terminal of the AND circuit 32, and an output of the delay circuit 42 is connected to the other input terminal of the AND circuit 32. An output terminal of the AND circuit 32 is connected to an input terminal of the inverter 33. The output terminal of the inverter 25 illustrated in FIG. 1 is connected to an input terminal of the delay circuit 42.

An output terminal of the inverter 33 is connected to a gate terminal of the Pch-MOSFET 34.

In the high-side drive circuit 3, when the control signal HSon's changes from the low level to the high level, the Nch-MOSFET 31 turns off through the inverter 30, the Pch-MOSFET 36 turns on through the inverter 35, and the first drive voltage generated by the voltage-difference generating circuit 37 is supplied from the power source voltage Vreg to the gate terminal Hgate. Thereafter, when a delay time determined by the delay circuit 42 elapses, the Pch-MOSFET 34 turns on through the AND circuit 32 and the inverter 33, and the power source voltage Vreg as a second drive voltage is supplied to the gate terminal Hgate.

When the control signal HSon's of the high level that is a control signal to turn on the high-side MOSFET 4 is received, the high-side drive circuit 3 supplies the first drive voltage and the second drive voltage to the gate terminal of the high-side MOSFET 4 in order from a lower one.

Figure 3:
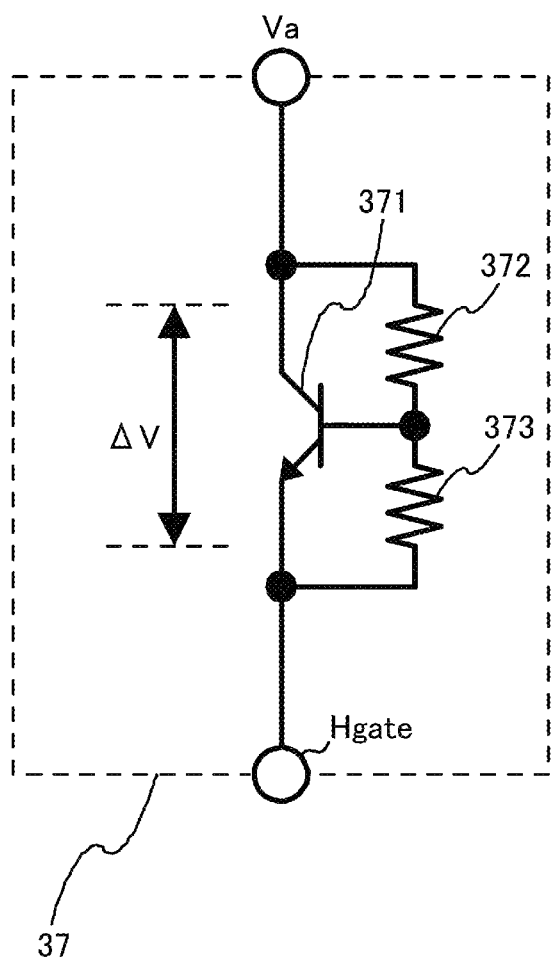
FIG. 3 is a diagram that illustrates an example of the circuit configuration of a voltage-difference generating circuit 37 illustrated in FIG. 2.

FIG. 3 is a diagram that illustrates an example of the circuit configuration of the voltage-difference generating circuit 37 illustrated in FIG. 2.

The voltage-difference generating circuit 37 includes an NPN transistor 371, a resistor 372, and a resistor 373 and configures a VBE multiplier circuit by using such components. The voltage-difference generating circuit 37 functions as a voltage generating circuit that generates a lowest drive voltage (that is, the first drive voltage) out of the first drive voltage and the second drive voltage by dropping down the power source voltage Vreg.

A collector terminal of the NPN transistor 371 is connected to the drain terminal Va of the Pch-MOSFET 36, and an emitter terminal of the NPN transistor 371 is connected to the gate terminal Hgate.

The resistors 372 and 373 are connected in series, and one end of a series circuit configured by the resistors 372 and 373 is connected to the collector terminal of the NPN transistor 371, and the other end of the series circuit is connected to the emitter terminal of the NPN transistor 371. A base terminal of the NPN transistor 371 is connected to a connection point between the resistors 372 and 373.

The voltage-difference generating circuit 37 can generate a desired voltage difference $\Delta V$ (the voltage of the drain terminal Va–the voltage of the gate terminal Hgate) by adjusting a ratio between the resistance values of the resistors 372 and 373.

The ratio between the resistors 372 and 373 is set such that a value acquired by subtracting the voltage difference $\Delta V$ from the power source voltage Vreg is within a range, which is equal to or higher than the threshold voltage Vth of the high-side MOSFET 4 and lower than the power source voltage Vreg.

Next, the operation of the switching power-supply device illustrated in FIG. 1 will be described with reference to FIG. 4.

Figure 4:
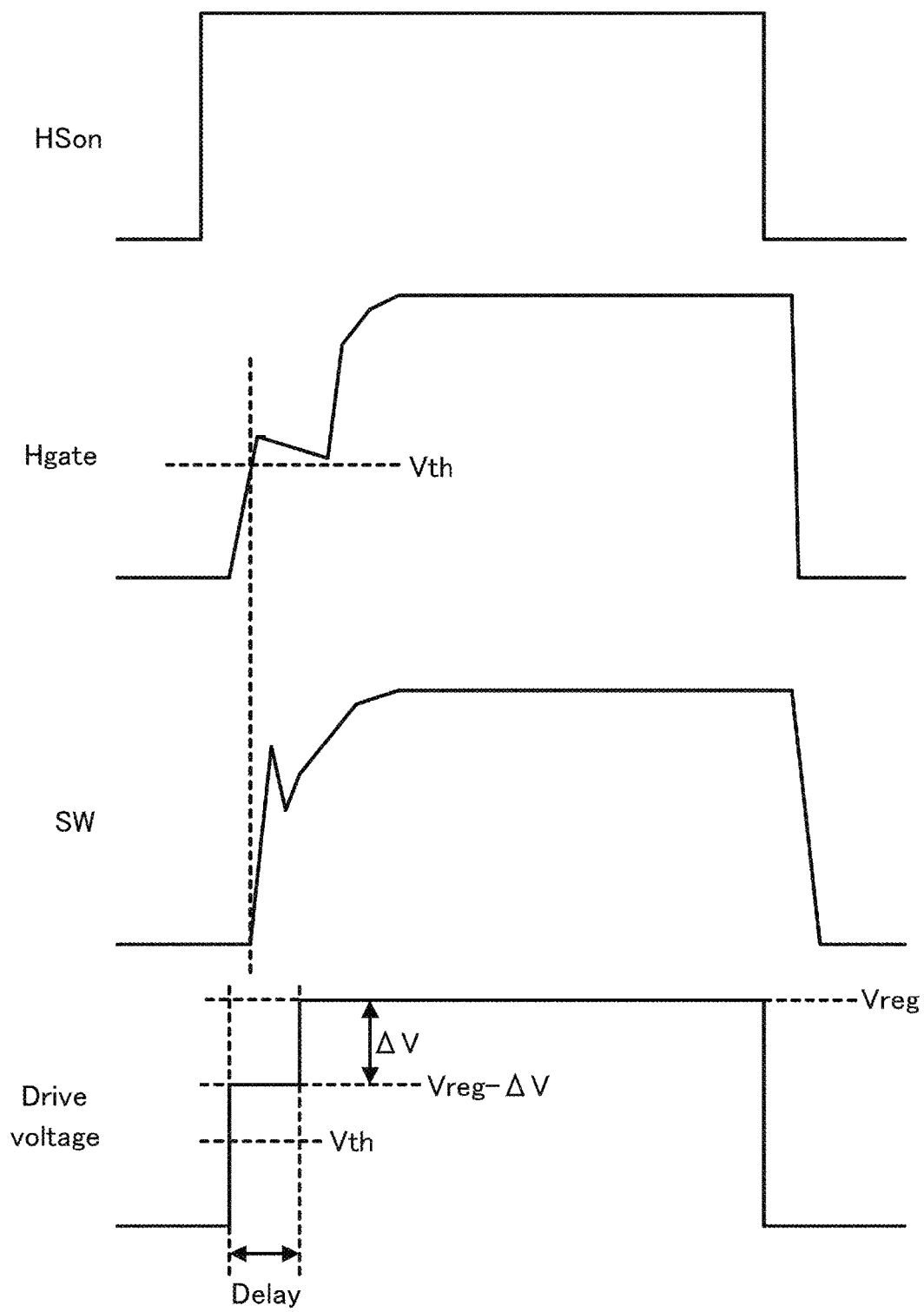
FIG. 4 is a timing diagram that illustrates the operation of the switching power-supply device illustrated in FIG. 1.

"HSon" illustrated in FIG. 4 represents a change of the control signal HSon. "Hgate" illustrated in FIG. 4 represents a change of the gate voltage of the high-side MOSFET 4. "SW" illustrated in FIG. 4 represents a change of the voltage of the switching terminal SW. "Drive voltage" illustrated in FIG. 4 represents a change of the drive voltage supplied from the high-side drive circuit 3 to the gate terminal Hgate.

At timing when the control signal HSon supplied from the on/off controller 1 is at the low level, the low-side drive circuit 5 turns on the low-side MOSFET 6. Meanwhile, the high-side drive circuit 3 configured to have a logic for turning off the high-side MOSFET 4 through the level shift circuit 2, and thus the voltage of the switching terminal SW is at the low level. At this time, the bootstrap capacitor 104 is charged by receiving the supply of a current from the regulator 7.

When the control signal HSon supplied from the on/off controller 1 is changed from the low level to the high level, the level shift Nch-MOSFET 21 turns on. Accordingly, the input voltage of the inverter 25 becomes the low level, and the control signal HSon' of the high-side drive circuit 3 becomes the high level.

In the high-side drive circuit 3, when the control signal HSon's is changed from the low level to the high level, first, the Nch-MOSFET 31 is turned off through the inverter 30, and the Pch-MOSFET 36 is turned on through the inverter 35.

The voltage of the gate terminal Hgate immediately after the Pch-MOSFET 36 is turned on is a voltage acquired by subtracting the voltage difference $\Delta V$ generated by the voltage-difference generating circuit 37 from the voltage (the power source voltage Vreg) between the bootstrap terminal BS and the switching terminal SW ("Vreg–$\Delta V$" illustrated in FIG. 4), and then the high-side MOSFET 4 is driven.

Hereinafter, a relation between feedback capacitance generated between the gate and the drain of the high-side MOSFET 4 and a counter-electromotive force will be described.

The feedback capacitance Crss is approximated to a value acquired by multiplying the gate-to-drain capacitance Cgd of the high-side MOSFET 4 by a gain (which is nearly equal to Gm×Ro) of the high-side MOSFET 4 and can be represented as follows.

$$Crss \approx Cgd \times Gm \times Ro \ldots \quad (1)$$

Here, "Gm" is transconductance of the high-side MOSFET 4, and "Ro" represents impedance as seen from the drain terminal of the high-side MOSFET 4. When Kp is a constant that is determined based on the process or an element size, and the drive voltage supplied to the gate terminal Hgate of the high-side MOSFET 4 is Vgs, the transconductance Gm can be represented as follows.

$$Gm \approx Kp \times (Vgs - Vth) \ldots \quad (2)$$

The transconductance Gm, as represented in Equation (2), is proportional to a difference between the threshold voltage Vth of the high-side MOSFET 4 and the drive voltage Vgs of the high-side MOSFET 4. The feedback capacitance Crss, as represented in Equation (1), tends to increase as the transconductance Gm is increased.

As described above, if the drive voltage Vgs supplied to the gate terminal Hgate immediately after turning on the high-side MOSFET 4 is set to be low as far as possible while a voltage of a lowest limit turning on the high-side MOSFET is secured, the feedback capacitance is decreased and the counter-electromotive force can be decreased.

In the example illustrated in FIG. 4, since the first drive voltage (Vreg−ΔV) has a value that is slightly larger than the threshold voltage Vth of the high-side MOSFET 4, a counter-electromotive force is generated according to the magnitude of the voltage acquired by subtracting the threshold voltage Vth from the first drive voltage (Vreg−ΔV). However, since this voltage is sufficiently lower than the voltage acquired by subtracting the threshold voltage Vth from the power source voltage Vreg, the counter-electromotive force is smaller than that of a case where the high-side MOSFET 4 is driven using only the power source voltage Vreg, whereby a noise can be suppressed.

When a delay period ("DELAY" illustrated in FIG. 4) determined by the delay circuit 42 elapses after the control signal HSon' changes from the low level to the high level, the Pch-MOSFET 34 is turned on through the AND circuit 32 and the inverter 33. Accordingly, a second drive voltage (the power source voltage Vreg) that is sufficient for decreasing the on-resistance of the high-side MOSFET 4 is supplied to the gate terminal Hgate of the high-side MOSFET 4.

According to a series of the operations described above, when the control signal HSon' changes from the low level to the high level, the drive voltage supplied to the gate terminal Hgate is changed in two stages in order of the lowest to highest voltage. Accordingly, in a state immediately after causing the high-side MOSFET 4 to be tuned ON, the counter-electromotive force is decreased by suppressing the feedback capacitance to be low, whereby low noise can be realized. In addition, by decreasing the counter-electromotive force, the durability of the switching terminal SW can be improved, whereby the reliability of the control circuit 100 can be improved.

The counter electromotive force described above is not generated shortly after the high-side MOSFET 4 is changed from the OFF state to the ON state. Since a time until the counter electromotive force disappears after the supply of the drive voltage to the gate terminal Hgate of the high-side MOSFET 4 is experimentally known, by setting the delay time set in the delay circuit 42 to be this time or more, the generation of the counter-electromotive force of a case where the second drive voltage is supplied to the gate terminal Hgate can be prevented.

The voltage-difference generating circuit 37 illustrated in FIG. 2 may be a circuit that can step down the power source voltage Vreg by a desired amount and, for example, may be configured by one resistor, a diode, or the like.

In the description presented above, while the drive voltage supplied to the gate terminal Hgate is changed in two stages when the control signal HSon' changes from the low level to the high level, the drive voltage is not limited thereto. Thus, the high-side MOSFET 4 may be driven by changing the drive voltage in three stages or more.

Hereinafter, a configuration employed in a case where the high-side MOSFET 4 is driven by changing the drive voltage in three stages will be described.

Figure 5:
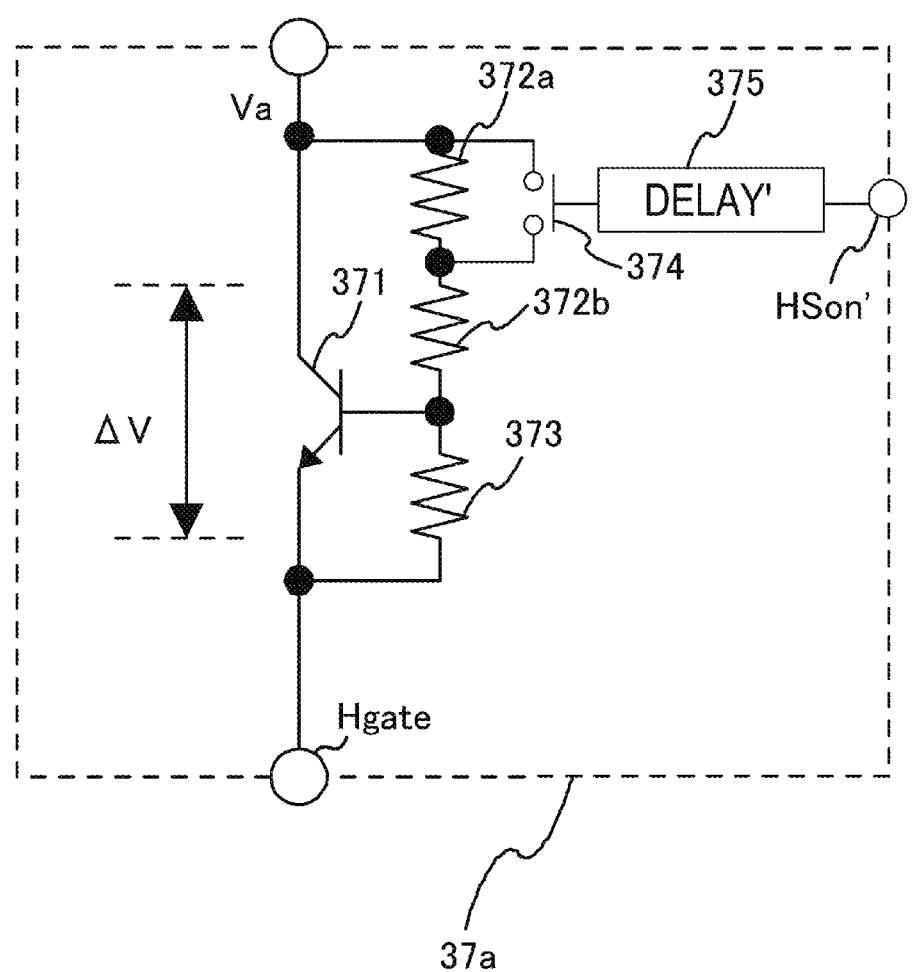
FIG. 5 is a diagram that illustrates an example of the circuit configuration of a voltage-difference generating circuit 37a that is a modified example of the voltage-difference generating circuit 37 illustrated in FIG. 2.

FIG. 5 is a diagram that illustrates an example of the circuit configuration of a voltage-difference generating circuit 37a that is a modified example of the voltage-difference generating circuit 37 illustrated in FIG. 2. The voltage-difference generating circuit 37a functions as a voltage generating circuit that generates a lowest drive voltage among three drive voltages by dropping down the power source voltage Vreg.

The voltage-difference generating circuit 37a illustrated in FIG. 5 includes an NPN transistor 371, a resistor 372a, a resistor 372b, a resistor 373, a switch 374, and a delay circuit (Delay') 375.

A collector terminal of the NPN transistor 371 is connected to the drain terminal Va of the Pch-MOSFET 36. An emitter terminal of the NPN transistor 371 is connected to the gate terminal Hgate.

The resistors 372a, 372b, and 373 are connected in series in the mentioned order.

A terminal opposite to the side of a connection point between the resistors 372a and 372b is connected to the collector terminal of the NPN transistor 371. A terminal opposite to the side of a connection point between the resistors 373 and 372b is connected to the emitter terminal of the NPN transistor 371. A base terminal of the NPN transistor 371 is connected to the connection point between the resistors 372b and 373.

The switch 374 is connected between the connection point between the resistors 372a and 372b and the connection point between the resistor 372a and the drain terminal Va. The switch 374 is controlled according to an output signal of the delay circuit 375, and is in the ON state when this output signal is at the high level and is in the OFF state when this output signal is at the low level.

An input terminal of the delay circuit 375 is connected to the output terminal of the inverter 25 illustrated in FIG. 1 and delays the input control signal HSon' by a second delay time that is shorter than the delay time set in the delay circuit 42 illustrated in FIG. 2.

According to such a configuration, immediately after the control signal HSon's is switched from the low level to the high level, the switch 374 is in the OFF state. Accordingly, the voltage difference ΔV has a first value, and a lowest drive voltage acquired by subtracting the first value from the power source voltage Vreg is supplied to the gate terminal Hgate.

When a second delay time set in the delay circuit 375 elapses from complete switching of the control signal HSon' from the low level to the high level, the switch 374 is in the ON state. For this reason, the voltage difference ΔV has a second value smaller than the first value, and an intermediate drive voltage acquired by subtracting the second value from the power source voltage Vreg is supplied to the gate terminal Hgate.

When a delay time set in the delay circuit 42 elapses from complete switching of the control signal HSon' from the low level to the high level, the power source voltage Vreg is supplied to the gate terminal Hgate.

The lowest drive voltage described above is set to be the threshold voltage Vth of the high-side MOSFET 4 or higher and lower than the intermediate drive voltage. In this way, when the control signal HSon' is switched from the low level to the high level, also by driving the high-side MOSFET 4 in order of the lowest drive voltage, the intermediate drive voltage, and the power source voltage Vreg, the generation of a counter electromotive force can be suppressed.

As described above, when the control signal HSon's is switched from the low level to the high level, the high-side drive circuit 3 drives the high-side MOSFET 4 by supplying a plurality of drive voltages, which includes a drive voltage equal to or higher than the threshold voltage Vth of the high-side MOSFET 4 and at least one drive voltage higher than this drive voltage to the gate terminal of the high-side MOSFET 4, in order from a lowest voltage. Therefore, a low noise and high reliability of the switching power-supply device can be realized.

In addition, if the lowest drive voltage among the plurality of drive voltages is set to have the same value as the threshold voltage Vth of the high-side MOSFET 4, a counter electromotive force is not generated in principle and thus a noise can be decreased the most.

[Second Embodiment]

Figure 6:
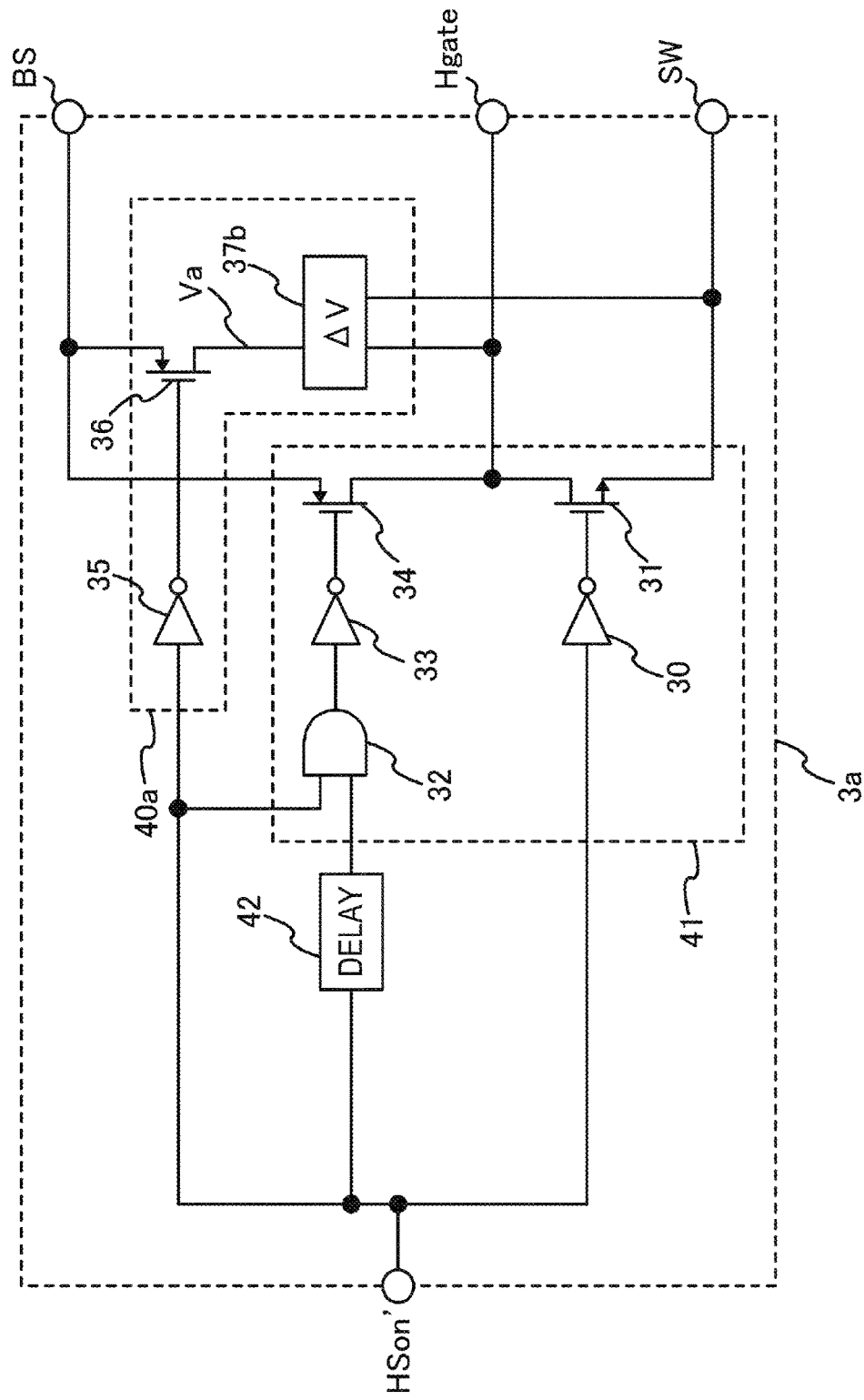
FIG. 6 is a diagram that illustrates the circuit configuration of a high-side drive circuit 3a that is a modified example of the high-side drive circuit 3 illustrated in FIG. 2.

FIG. 6 is a diagram that illustrates the circuit configuration of a high-side drive circuit 3a that is a modified example of the high-side drive circuit 3 illustrated in FIG. 2. In FIG. 6, the same reference numeral is assigned to the same configuration as that illustrated in FIG. 2, and description thereof will not be presented.

The high-side drive circuit 3a has the same configuration as the high-side drive circuit 3 illustrated in FIG. 2 except for the substitution of the sub drive circuit 40 with a sub drive circuit 40a.

The sub drive circuit 40a has the same configuration as the sub drive circuit 40 except for the substitution of the voltage-difference generating circuit 37 with a voltage-difference generating circuit 37b, and thus only the voltage-difference generating circuit 37b will be described. The voltage-difference generating circuit 37b functions as a voltage generating circuit that generates a lowest drive voltage (in other words, a first drive voltage) among the first drive voltage and the second drive voltage, by dropping down a power source voltage Vreg.

Figure 7:
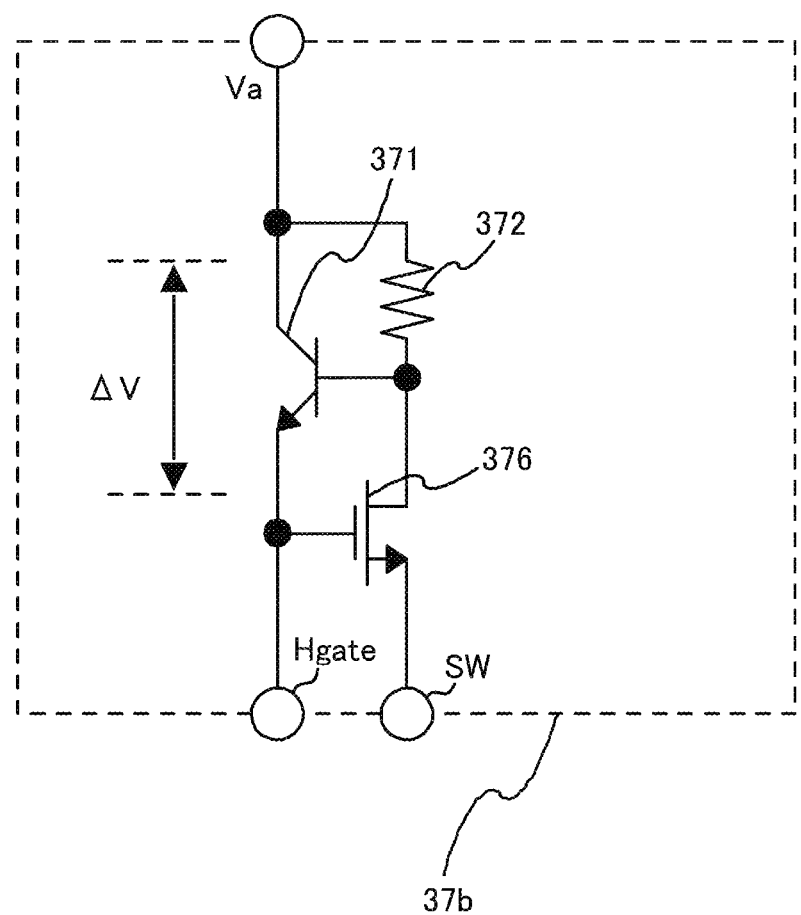
FIG. 7 is a diagram that illustrates an example of the circuit configuration of a voltage-difference generating circuit 37b illustrated in FIG. 6.

FIG. 7 is a diagram that illustrates an example of the circuit configuration of the voltage-difference generating circuit 37b illustrated in FIG. 6. In FIG. 7, a same reference numeral is assigned to the same configuration as that illustrated in FIG. 3.

The voltage-difference generating circuit 37b includes an NPN transistor 371, a resistor 372, and an Nch-MOSFET 376.

A collector terminal of the NPN transistor 371 is connected to a drain terminal Va of the Pch-MOSFET 36, and an emitter terminal of the NPN transistor 371 is connected to a gate terminal Hgate.

One end of the resistor 372 is connected to the collector terminal of the NPN transistor 371, and the other end of the resistor 372 is connected to a drain terminal of the Nch-MOSFET 376. A connection point between the resistor 372 and the drain terminal of the Nch-MOSFET 376 is connected to a base terminal of the NPN transistor 371.

A gate terminal of the Nch-MOSFET 376 is connected to a connection point between an emitter terminal of the NPN transistor 371 and the gate terminal Hgate. A source terminal of the Nch-MOSFET 376 is connected to a switching terminal SW.

The voltage-difference generating circuit 37b configured in this way performs control of a value of the voltage difference ΔV based on a current flowing through the Nch-MOSFET 376 such that a first drive voltage supplied to the gate terminal Hgate of the high-side MOSFET 4 is close to a threshold voltage Vth of the high-side MOSFET 4.

Figure 8:
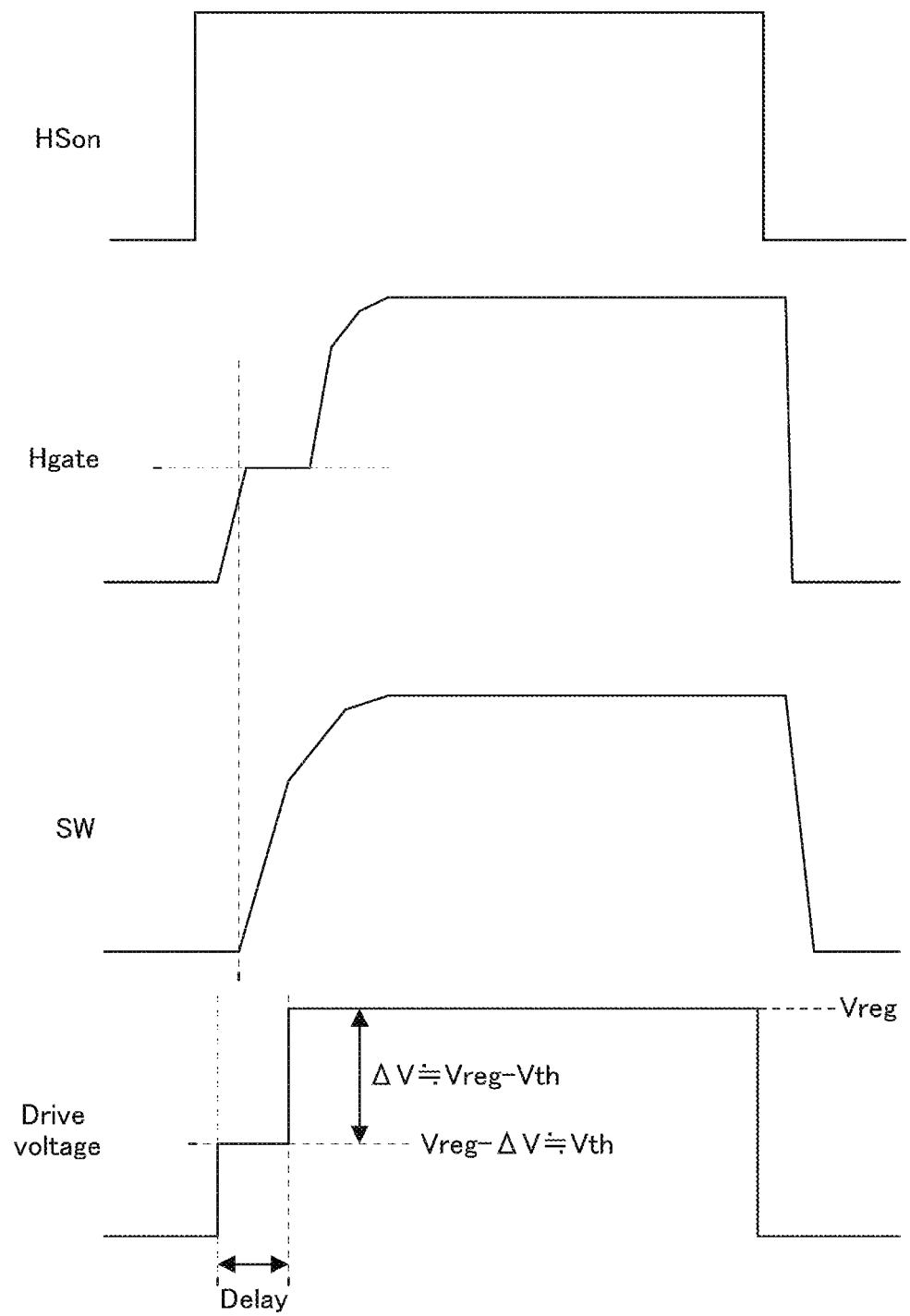
FIG. 8 is a timing diagram that illustrates the operation of a switching power-supply device including the high-side drive circuit 3a illustrated in FIG. 6.

Next, the operation of a switching power-supply device including the high-side drive circuit 3a illustrated in FIG. 6 will be described with reference to FIG. 8.

When the control signal HSon supplied from the on/off controller 1 is changed from the low level to the high level, the level shift Nch-MOSFET 21 turns on. Accordingly, the input voltage of the inverter 25 becomes the low level, and the control signal HSon' of the high-side drive circuit 3 becomes the high level.

In the high-side drive circuit 3, when the control signal HSon's is changed from the low level to the high level, first, the Nch-MOSFET 31 is turned off through the inverter 30, and the Pch-MOSFET 36 is turned on through the inverter 35.

A first drive voltage supplied to the gate terminal Hgate immediately after the Pch-MOSFET 36 is turned on is a voltage acquired by subtracting an initial voltage difference ΔV generated by the voltage-difference generating circuit 37b from the voltage (the power source voltage Vreg) between the bootstrap terminal BS and the switching terminal SW. Accordingly, the high-side MOSFET 4 is driven, and the high-side MOSFET 4 is turned on.

The initial voltage difference ΔV generated by the voltage-difference generating circuit 37b immediately after the switching of the control signal HSon' from the low level to the high level is set such that a value acquired by subtracting the voltage difference ΔV from the power source voltage Vreg is larger than the threshold voltage Vth of the high-side MOSFET 4.

When the high-side MOSFET 4 turns on, a sense current according to a current (drain current) flowing through the drain terminal of the high-side MOSFET 4 flows also through the Nch-MOSFET 376. For this reason, an electric potential difference is generated between both ends of the resistor 372, and the base voltage and the emitter voltage of the NPN transistor 371 are controlled according to the electric potential difference.

When the voltage of the gate terminal Hgate of the high-side MOSFET 4 is higher than the threshold voltage Vth, the drain current of the high-side MOSFET 4 increases, and thus the sense current increases as well, whereby the electric potential difference of the resistor 372 increases. For this reason, the base voltage of the NPN transistor 371 is controlled to be low. As a result, the first drive voltage supplied to the gate terminal Hgate is controlled so as to be low.

On the other hand, when the voltage of the gate terminal Hgate of the high-side MOSFET 4 is lower than the threshold voltage Vth, the drain current of the high-side MOSFET 4 decreases, and thus the sense current decreases as well, whereby the electric potential difference of the resistor 372 decreases. For this reason, the base voltage of the NPN transistor 371 is controlled to be high. As a result, the first drive voltage supplied to the gate terminal Hgate is controlled so as to be low.

According to a series of the operations described above, the voltage difference ΔV is controlled based on a sense current according to the drain current of the high-side MOSFET 4. Accordingly, the first drive voltage supplied to the gate terminal Hgate of the high-side MOSFET 4 is fed back and controlled so as to be about the same as the threshold voltage Vth. For this reason, the generation of a counter-electromotive force can be completely suppressed.

[Third Embodiment]

Figure 9:
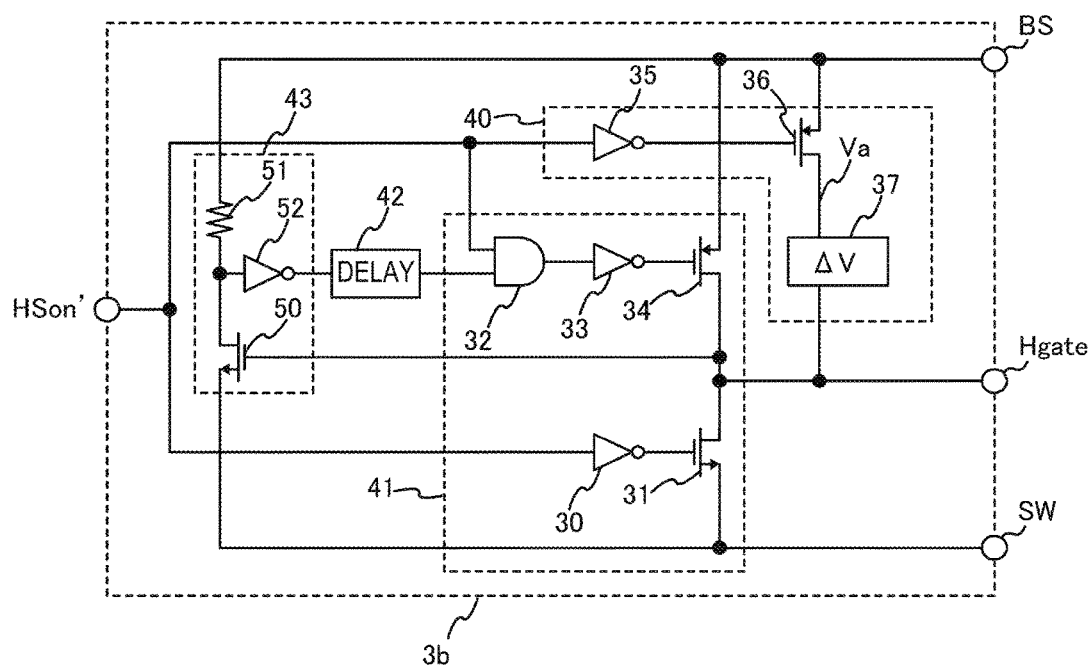
FIG. 9 is a diagram that illustrates the circuit configuration of a high-side drive circuit 3b that is a modified example of the high-side drive circuit 3 illustrated in FIG. 2.

FIG. 9 is a diagram that illustrates the circuit configuration of a high-side drive circuit 3b that is a modified example of the high-side drive circuit 3 illustrated in FIG. 2. In FIG. 9, a same reference numeral is assigned to the same configuration as that illustrated in FIG. 2, and description thereof will not be presented.

The high-side drive circuit 3b has the same configuration as the high-side drive circuit 3 except for the addition of an on-detection circuit 43.

The on-detection circuit 43 includes an Nch-MOSFET 50, a resistor 51, and an inverter 52 configuring a current detecting circuit detecting a current flowing through the high-side MOSFET 4.

A gate terminal of the Nch-MOSFET 50 is connected to a connection point between an Nch-MOSFET 31 and a Pch-MOSFET 34. A source terminal of the Nch-MOSFET 50 is connected to a switching terminal SW, and a drain terminal of the Nch-MOSFET 50 is connected to one end of the resistor 51.

The other end of the resistor 51 is connected to a bootstrap terminal BS.

An input terminal of the inverter 52 is connected to a connection point between the resistor 51 and the Nch-MOSFET 50, and an output terminal of the inverter 52 is connected to a delay circuit 42.

Next, the operation of a switching power-supply device including the high-side drive circuit 3b illustrated in FIG. 9 will be described.

When the control signal HSon supplied from the on/off controller 1 is changed from the low level to the high level, the level shift Nch-MOSFET 21 turns on. Accordingly, the input voltage of the inverter 25 becomes the low level, and the control signal HSon' of the high-side drive circuit 3 becomes the high level.

In the high-side drive circuit 3, when the control signal HSon's is changed from the low level to the high level, first, the Nch-MOSFET 31 is turned off through the inverter 30, and the Pch-MOSFET 36 is turned on through the inverter 35. Accordingly, the first drive voltage is supplied to the gate terminal Hgate, and the high-side MOSFET 4 is turned on.

Here, the same voltage as the first drive voltage supplied to the gate terminal Hgate of the high-side MOSFET 4 is supplied to the gate terminal of the Nch-MOSFET 50. A source terminal of the Nch-MOSFET 50, similar to the source terminal of the high-side MOSFET 4, is connected to the switching terminal SW. For this reason, a sense current (current detection signal) according to a drain current flowing through the drain terminal of the high-side MOSFET 4 flows through the drain terminal of the Nch-MOSFET 50.

When the sense current starts to flow through the drain terminal of the Nch-MOSFET 50, and this sense current exceeds a detection threshold for which the high-side MOSFET 4 is determined to be turned on, the output of the inverter 52 becomes the high level. Thereafter, when a delay time set in the delay circuit 42 elapses, and the Pch-MOSFET 34 is turned on, a second drive voltage (power source voltage) is supplied to the gate terminal Hgate.

In this way, the on-detection circuit 43 can accurately detect timing when the high-side MOSFET 4 is turned on based on the sense current (current detection signal) according to the drain current of the high-side MOSFET 4. For this reason, the delay time set in the delay circuit 42 can be shortened, and the occurrence of a switching loss can be suppressed. Accordingly, high power conversion efficiency can be realized.

In addition, in the circuit configuration illustrated in FIG. 9, it may be configured such that the delay circuit 42 is omitted and the output terminal of the inverter 52 is directly connected to the input terminal of the AND circuit 32. In such a case, as the high-side MOSFET 4 is turned on, the Pch-MOSFET 34 is immediately turned on. According to this configuration, higher power conversion efficiency can be realized.

[Fourth Embodiment]

Figure 10:
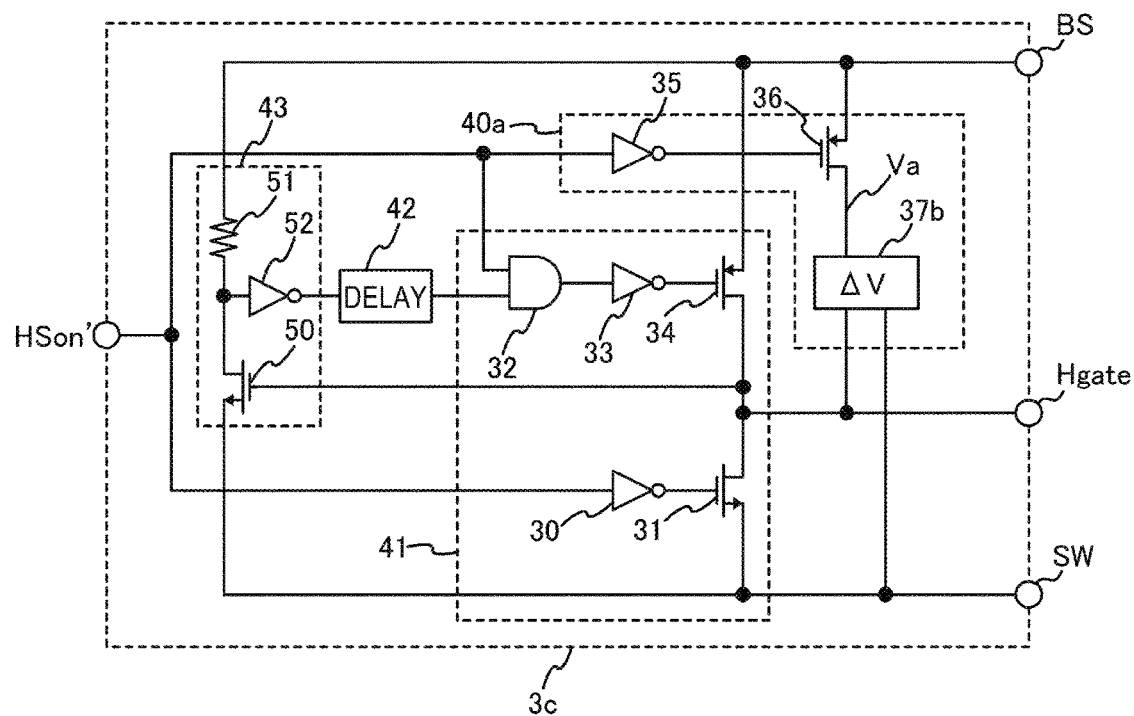
FIG. 10 is a diagram that illustrates the circuit configuration of a high-side drive circuit 3c that is a modified example of the high-side drive circuit 3 illustrated in FIG. 2.

FIG. 10 is a diagram that illustrates the circuit configuration of a high-side drive circuit 3c that is a modified example of the high-side drive circuit 3 illustrated in FIG. 2. In FIG. 10, a same reference numeral is assigned to the same configuration as that illustrated in FIGS. 6 and 9, and description thereof will not be presented.

The high-side drive circuit 3c has the same configuration as the high-side drive circuit 3a illustrated in FIG. 6 except for the addition of an on-detection circuit 43.

According to this configuration, the effects described in the second embodiment and the effects described in the third embodiment can be acquired.

Similar to the third embodiment, in the configuration illustrated in FIG. 10, a configuration may be employed in which the delay circuit 42 is omitted, and the output terminal of the inverter 52 is directly connected to the AND circuit 32.

In the embodiments described above, the Pch-MOSFET 36 functions as a first sub switching element, and the Pch-MOSFET 34 functions as a second sub switching element. In addition, each of the high-side drive circuits 3, 3a, 3b, and 3c functions as a drive circuit.

In the embodiments described above, while a case in which the present invention is applied to the high-side drive circuit 3 driving the high-side MOSFET 4 has been described, the present invention may be applied to the low-side drive circuit 5 driving the low-side MOSFET 6.

As above, while the present disclosure has been described in concrete embodiments, the embodiments described above are merely examples, and thus, it is apparent that changes can be made therein in a range not departing from the concept of the present disclosure.

As described above, in description presented here, the following items are disclosed.

(1) A control circuit of a switching power-supply device that converts a first DC voltage supplied from an input power source into a second DC voltage by turning on/off a switching element connected between the input power source and an inductor and outputs the second DC voltage, the control circuit includes: a drive circuit that, when a control signal to turn on the switching element is received, drives the switching element by supplying a plurality of drive voltages starting in order from a lowest drive voltage among the plurality of drive voltages, to a control terminal of the switching element.

(2) In the control circuit of the switching power-supply device described in (1), the lowest drive voltage among the plurality of drive voltages is a threshold voltage of the switching element or more.

(3) In the control circuit of the switching power-supply device described in (1), the drive circuit supplies the lowest drive voltage among the plurality of drive voltages to the control terminal until a time predetermined in advance elapses after the control signal is received.

(4) In the control circuit of the switching power-supply device described in (1), the drive circuit includes a current detecting circuit that detects a current flowing through the switching element, and the drive circuit supplies the lowest drive voltage among the plurality of drive voltages to the control terminal until a current detection signal detected by the current detecting circuit arrives at a detection threshold in a state where the control signal is received.

(5) In the control circuit of the switching power-supply device described in (1), the drive circuit includes a voltage generating circuit that generates the lowest drive voltage among the plurality of drive voltages by dropping down a supplied power source voltage, and the voltage generating circuit performs control for causing the lowest drive voltage supplied to the control terminal to approach a threshold voltage of the switching element based on a current flowing through the switching element.

(6) In the control circuit of the switching power-supply device described in (1), wherein the drive circuit includes: a voltage generating circuit that generates a first drive voltage by dropping down a supplied power source voltage; a first sub switching element that supplies the first drive voltage generated by the voltage generating circuit to the control terminal, in response to input of the control signal; a delay circuit that delays the control signal; and a second sub switching element that supplies the power source voltage to the control terminal as a second drive voltage, in response to receiving of receives the delayed control signal delayed by the delay circuit.

(7) In the control circuit of the switching power-supply device described in (6), the voltage generating circuit performs control for causing the first drive voltage supplied to the control terminal to approach a threshold voltage of the switching element based on a current flowing through the switching element when the first drive voltage is being supplied to the control terminal.

(8) In the control circuit of the switching power-supply device described in (1), the drive circuit includes: a voltage generating circuit that generates a first drive voltage by dropping down a supplied power source voltage; a first sub switching element that supplies the first drive voltage generated by the voltage generating circuit to the control terminal, in response to input of the control signal; a current detecting circuit that detects a current flowing through the switching element; and a second sub switching element that supplies the power source voltage to the control terminal as a second drive voltage, in response to that a current detection signal detected by the current detecting circuit arrives at a detection threshold in a state where the control signal is input.

(9) In the control circuit of the switching power-supply device described in (8), the voltage generating circuit performs control for causing the first drive voltage supplied to the control terminal to approach a threshold voltage of the switching element based on the current flowing through the switching element when first drive voltage is being supplied to the control terminal.

(10) A switching power-supply device includes: the control circuit of the switching power-supply device described in (1); and a switching element that is controlled by the control circuit.

What is claimed is:

1. A control circuit of a switching power-supply device that converts a first DC voltage supplied from an input power source into a second DC voltage by turning on/off a switching element connected between the input power source and an inductor and outputs the second DC voltage, the control circuit comprising:
    a drive circuit that, when a control signal to turn on the switching element is received, drives the switching element by supplying a plurality of drive voltages that includes a first drive voltage and a second drive voltage, to a control terminal of the switching element,
    wherein the second drive voltage is higher than the first drive voltage,
    wherein the first drive voltage among the plurality of drive voltages is equal to or higher than a threshold voltage of the switching element,
    wherein, after the switching element is turned on by the first drive voltage, the second drive voltage is supplied to the switching element,
    wherein the first drive voltage, supplied by the drive circuit, is constant during a predetermined time, and
    wherein, after the predetermined time elapses, the second drive voltage is supplied by the drive circuit.

2. The control circuit of the switching power-supply device according to claim 1,
    wherein the drive circuit includes a current detecting circuit that detects a current flowing through the switching element, and
    wherein the drive circuit supplies the first drive voltage to the control terminal until a current detection signal detected by the current detecting circuit arrives at a detection threshold in a state where the control signal is received.

3. The control circuit of the switching power-supply device according to claim 1,
    wherein the drive circuit includes a voltage generating circuit that generates the first drive voltage by dropping down a supplied power source voltage, and
    wherein the voltage generating circuit performs control for causing the first drive voltage supplied to the control terminal to approach the threshold voltage of the switching element based on a current flowing through the switching element.

4. The control circuit of the switching power-supply device according to claim 1,
    wherein the drive circuit includes:
        a voltage generating circuit that generates the first drive voltage by dropping down a supplied power source voltage;
        a first sub switching element that supplies the first drive voltage generated by the voltage generating circuit to the control terminal, in response to input of the control signal;
        a delay circuit that delays the control signal; and
        a second sub switching element that supplies the power source voltage to the control terminal as the second drive voltage, in response to receiving of receives the delayed control signal delayed by the delay circuit.

5. The control circuit of the switching power-supply device according to claim 4,
    wherein the voltage generating circuit performs control for causing the first drive voltage supplied to the control terminal to approach the threshold voltage of the switching element based on a current flowing through the switching element when the first drive voltage is being supplied to the control terminal.

6. The control circuit of the switching power-supply device according to claim 1,
wherein the drive circuit includes:
a voltage generating circuit that generates the first drive voltage by dropping down a supplied power source voltage;
a first sub switching element that supplies the first drive voltage generated by the voltage generating circuit to the control terminal, in response to input of the control signal;
a current detecting circuit that detects a current flowing through the switching element; and
a second sub switching element that supplies the power source voltage to the control terminal as the second drive voltage, in response to that a current detection signal detected by the current detecting circuit arrives at a detection threshold in a state where the control signal is input.

7. The control circuit of the switching power-supply device according to claim 6,
wherein the voltage generating circuit performs control for causing the first drive voltage supplied to the control terminal to approach the threshold voltage of the switching element based on the current flowing through the switching element when first drive voltage is being supplied to the control terminal.

8. A switching power-supply device comprising:
the control circuit of the switching power-supply device according to claim 1; and
a switching element that is controlled by the control circuit.

9. A control circuit of a switching power-supply device that converts a first DC voltage supplied from an input power source into a second DC voltage by turning on/off a switching element connected between the input power source and an inductor and outputs the second DC voltage, the control circuit comprising:
a drive circuit that, when a control signal to turn on the switching element is received, drives the switching element by supplying a plurality of drive voltages that includes a first drive voltage and a second drive voltage, to a control terminal of the switching element,
wherein the second drive voltage is higher than the first drive voltage,
wherein the first drive voltage among the plurality of drive voltages is equal to or higher than a threshold voltage of the switching element and is constant,
wherein the drive circuit includes a delay circuit that delays the control signal;
wherein, after the switching element is turned on by the first drive voltage, in response to receiving the delayed control signal delayed by the delay circuit, the second drive voltage is supplied to the switching element.

* * * * *